United States Patent
Foong et al.

(10) Patent No.: US 6,337,225 B1
(45) Date of Patent: Jan. 8, 2002

(54) METHOD OF MAKING STACKED DIE ASSEMBLIES AND MODULES

(75) Inventors: Sally Yin Lye Foong, Milpitas; Donald Bottarini, Los Gatos, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/537,732

(22) Filed: Mar. 30, 2000

(51) Int. Cl.⁷ .......................... H01L 21/44; H01L 21/48; H01L 21/50
(52) U.S. Cl. .......................... 438/106; 438/109; 438/110
(58) Field of Search ............................... 438/106, 109, 438/110

(56) References Cited

U.S. PATENT DOCUMENTS

| 5,281,852 A | 1/1994 | Normington |
| 5,291,061 A | 3/1994 | Ball |
| 5,323,060 A | 6/1994 | Fogal et al. |
| 5,397,916 A | 3/1995 | Normington |
| 5,434,745 A | 7/1995 | Shokrgozar et al. |
| 5,721,452 A | 2/1998 | Fogal et al. |
| 5,776,797 A | * 7/1998 | Nicewarner, Jr. et al. |
| 5,864,177 A | 1/1999 | Sundstrom |
| 5,874,781 A | 2/1999 | Fogal et al. |
| 5,886,412 A | 3/1999 | Fogal et al. |
| 5,963,794 A | 10/1999 | Fogal et al. |

* cited by examiner

Primary Examiner—John F. Niebling
Assistant Examiner—Josetta I. Jones

(57) ABSTRACT

Stacked die assemblies and modules are fabricated by a process wherein discrete first and second, very thin semiconductor IC dies or chips are adhesively bonded together to form a mechanically robust stacked die assembly. A plurality of stacked die assemblies are then adhesively bonded to a substrate, e.g., a circuit board, electrically contacted, and encapsulated in a suitable pottant material. The formation of mechanically robust stacked die assemblies prior rather than subsequent to bonding to the substrate effectively minimizes fracture or other damage to the very thin and fragile semiconductor dies or chips resulting from non-planarity of the substrate surface and/or non-uniformity of adhesive layer thickness.

20 Claims, 2 Drawing Sheets

METHOD OF MAKING STACKED DIE ASSEMBLIES AND MODULES

FIELD OF THE INVENTION

The present invention generally relates to a method for making semiconductor devices. More specifically, the present invention relates to a method for making stacked die assemblies and/or modules comprising at least one stacked die assembly including a plurality of vertically arranged semiconductor integrated circuit dies mounted on a suitable substrate surface.

BACKGROUND OF THE INVENTION

Integrated circuit (IC) semiconductor devices are typically formed from silicon (Si) or gallium arsenide (GaAs) wafers such that a plurality of individual devices are simultaneously formed on or within the same wafer. The finished wafers are then segmented, as by sawing, to form a plurality of discrete square or rectangularly-shaped IC units, termed a "die" or "chip". The continued increase in the density of IC-based devices, i.e., the number of transistors, etc., per $cm^2$ of die or chip area, has necessitated formation of multi-chip devices in a single package, i.e., wherein a plurality of dies or chips are vertically stacked. In many instances, such vertically stacked multi-chip modules can be fabricated faster and at less cost than by developing new substrate technology.

Multi-chip module technology is advantageous in view of the significant increase in device density per substrate unit area provided thereby. In turn, the increased device density yields corresponding improvements in signal propagation speed and overall device weight not obtainable by other means. Current multi-chip module fabrication technology typically utilizes a printed circuit board substrate to which a vertically stacked series of IC components or devices are directly adhered and electrically connected, as by wire bonding, tape automated bonding (TAB), flip-TAB, flip-chip, etc., techniques.

According to conventional methodology for fabricating vertically stacked die type multi-chip modules such as disclosed in, for example, U.S. Pat. Nos. 5,291,061 and 5,323,060, the entire disclosures of which are incorporated herein by reference, a first IC die or chip is attached to the circuit board substrate, as by adhesive bonding, and wire bonded to the substrate, followed by adhesive bonding thereon of at least a second IC die or chip, thereby forming a vertically stacked assembly of dies or chips. However, this conventional procedure entails a significant problem or difficulty associated with the attachment (i.e., bonding) of the first (i.e., lowermost) die or chip to the substrate surface, arising from a combination of substrate non-planarity and thinness, thus brittleness or fragility, of the semiconductor wafers utilized in manufacture of the IC dies or chips, i.e., 6–6.5 mils. thick wafers. In particular, substrate non-planarity and the extreme thinness of currently employed IC dies or chips can lead to warping of the first (i.e., lowermost) die of the stack, which deviation from non-planarity can be replicated by each of the overlying IC dies or chips of the vertical stack. In extreme instances, the stresses arising from the lack of planarity can cause breakage, as by fracture, of one or more dies or chips of the stack, resulting in reduction in product yield and/or device failure.

Accordingly, there exists a need for improved methodology for reliable manufacture of multi-chip assemblies and modules which avoids the drawbacks attendant upon fabrication according to conventional manufacturing processes, which methodology does not incur damage to the fragile, brittle semiconductor IC dies or chips, and which is fully compatible with the throughput requirements of mass manufacturing techniques.

The present invention, wherein first and second IC dies or chips are adhesively bonded together to form a more robust (i.e., rigid) stacked structure prior to adhesively bonding the lowermost die or chip to the substrate surface, effectively addresses and solves the above-described problems associated with bonding of a single, very thin and fragile IC die or chip to the substrate. Further, the methodology provided by the present invention enjoys diverse utility in the manufacture of variously configured multi-chip device arrangements and constructions.

DISCLOSURE OF THE INVENTION

An advantage of the present invention is an improved method of making a stacked die assembly mounted on a substrate surface.

Another advantage of the present invention is an improved method of forming a stacked die module comprising a plurality of stacked die assemblies mounted on a substrate surface.

Yet another advantage of the present invention is an improved stacked die assembly mounted on a substrate surface.

Still another advantage of the present invention is an improved stacked die module comprising a plurality of stacked die assemblies formed on a substrate surface.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of making a stacked die assembly mounted on a substrate surface, which method comprises the steps of:

(a) providing a substrate having a surface for mounting thereon at least one stacked die assembly;

(b) providing first and second semiconductor wafers, each of said wafers including a plurality of semiconductor integrated circuit (IC) devices in the form of dies or chips each having a pair of opposed major surfaces;

(c) segmenting the first semiconductor wafer to form a plurality of discrete first dies or chips;

(d) bonding one of the pair of opposed major surfaces of each of the discrete first dies or chips to one of the pair of opposed major surfaces of a respective die or chip of the second semiconductor wafer;

(e) segmenting the second wafer to form a plurality of stacked die assemblies each comprising a stacked, bonded pair of discrete first and second dies or chips; and (f) bonding the other one of the pair of opposed major surfaces of the discrete second die or chip of one of the stacked die assemblies to the substrate surface.

According to embodiments of the present invention, a method for making a stacked die module comprising a plurality of stacked die assemblies mounted on a substrate surface comprises a further step (g) of repeating step (f) at least once to bond at least one additional stacked die assembly formed in step (e) to the substrate surface.

According to further embodiments of the present invention, the method of making a stacked die assembly mounted on a substrate surface comprises the further steps of:

(g) providing an additional semiconductor wafer including a plurality of semiconductor IC devices in the form of dies or chips each having a pair of opposed major surfaces;

(h) segmenting the additional semiconductor wafer to form a plurality of discrete additional dies or chips; and (i) bonding one of the pair of opposed major surfaces of one of the plurality of discrete additional dies or chips to the other one of the pair of opposed major surfaces of the first discrete die or chip of the stacked die assembly bonded to the substrate surface, wherein steps (g)–(i) can be repeated n times, as desired, with n being an integer equal to or greater than 1.

According to particular embodiments of the present invention: step (a) comprises providing a circuit board substrate, e.g., a printed circuit board (PCB) substrate including contacts and/or conductors for making electrical connection to at least one of the first and second discrete dies or chips of the stacked die assembly; step (b) comprises providing first and second semiconductor wafers comprising first and second IC devices which are the same or different, and are comprised of silicon (Si) or gallium arsenide (GaAs); steps (c) and (e) each comprise utilizing a diamond saw for segmenting the first and second semiconductor wafers; steps (d) and (f) each comprise adhesive bonding, as by utilizing an epoxy-based adhesive, e.g., a "stage B" epoxy-based adhesive.

According to another aspect of the present invention, a stacked die assembly mounted on a substrate surface is provided, fabricated according to the following steps of:

(a) providing a substrate having a surface for mounting thereon at least one stacked die assembly;

(b) providing first and second semiconductor wafers, each of the wafers including a plurality of semiconductor integrated circuit (IC) devices in the form of dies or chips each having a pair of opposed major surfaces;

(c) segmenting the first semiconductor wafer to form a plurality of discrete first dies or chips;

(d) bonding one of the pair of opposed major surfaces of each of the discrete first dies or chips to one of the pair of opposed major surfaces of a respective die or chip of the second semiconductor wafer;

(e) segmenting the second wafer to form a plurality of stacked die assemblies each comprising a stacked, bonded pair of discrete first and second dies or chips; and (f) bonding the other one of the pair of opposed major surfaces of the discrete second die or chip of one of the stacked die assemblies to the substrate surface.

According to embodiments of the present invention, a stacked die module comprises a plurality of stacked die assemblies mounted on a substrate surface, fabricated by a method comprising repeating step (f) at least once to bond at least one additional stacked die assembly formed in step (e) to the substrate surface.

According to further embodiments of the present invention, the substrate comprises a circuit board substrate including contacts for making electrical connection to at least one of the first and second discrete dies or chips of each of the stacked die assemblies; the first and second semiconductor wafers comprise respective first and second semiconductor IC devices which are the same or different; and each of the bonding steps (d) and (f) comprises utilizing a layer of adhesive material.

According to particular embodiments of the present invention, each of the first and second semiconductor wafers comprises silicon (Si) or gallium arsenide (GaAs); and each of the layers of adhesive material comprises an epoxy-based adhesive material, e.g., a partially cured "stage B" epoxy.

According to still other embodiments of the present invention, each of the stacked die assemblies further comprises n additional stacked dies or chips, where n is an integer equal to or greater than 1.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features, wherein.

DESCRIPTION OF THE INVENTION

The present invention is based upon recognition that mounting of vertically stacked assemblies of semiconductor-based IC dies or chips on a suitable substrate surface, e.g., a printed circuit board (PCB) or ceramic-based substrate, can be accomplished in the substantial absence of any likelihood of incurring fracture or other damage of the very thin and fragile semiconductor-based dies or chips resulting from warping due to non-planarity of the substrate surface or non-uniform thickness of the adhesive bonding layer intermediate the substrate and lowermost die or chip surfaces. A key feature of the present invention is the formation of a more mechanically robust, i.e., rigid and less fracture-susceptible vertically stacked die or chip assembly, prior to adhesive bonding of the lowermost die or chip face to the substrate surface, whereby the likelihood of die warping resulting from substrate non-planarity or non-uniform adhesive thickness is avoided or at least substantially reduced.

Figure 1:
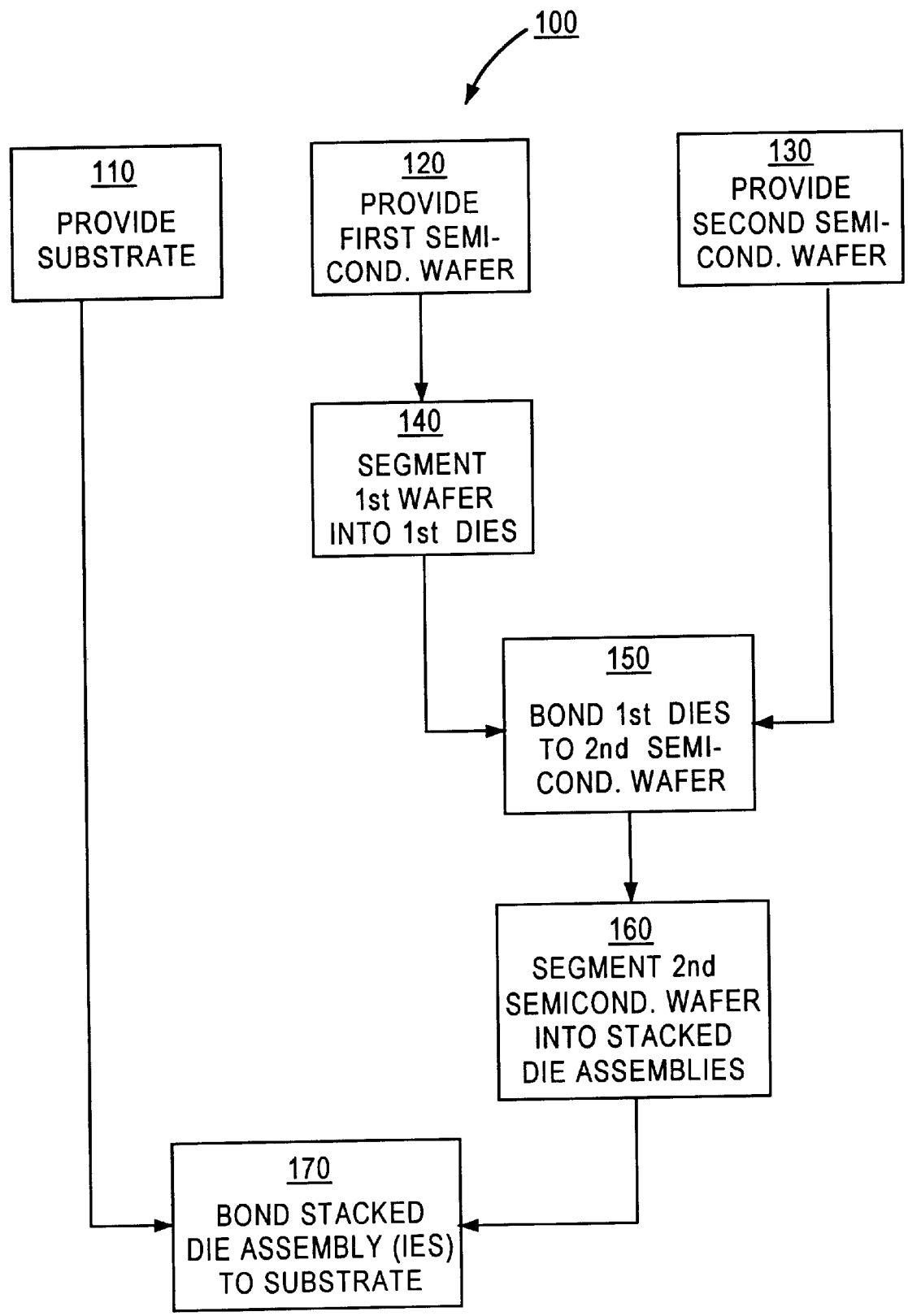
FIG. 1 is a flow chart illustrating a sequence of process steps for practicing an embodiment of the present invention.

Referring now to FIG. 1, shown therein, in block form, is a sequence (100) of processing steps illustrating an embodiment of the present invention. In a first step (110), a suitable substrate is provided, i.e., of conventional type comprising, for example, a printed or other type circuit board including a laminated or ceramic-based substrate or foundation material, and a suitable arrangement of conductive contacts, bumps, landing pads, etc., formed on the upper thereof for establishing, in a conventional manner, electrical contact with at least one vertically stacked die assembly bonded thereto, as by means of a layer of adhesive material.

According to the second (120) and third (130) steps of the embodiment, first and second very thin semiconductor wafers, e.g., about 6–6.5 mils. thick, are provided, each comprising a plurality of semiconductor integrated circuit (IC) devices each delineated by boundaries between adjacent devices. Typical semiconductor wafer materials include silicon (Si) and gallium arsenide (GaAs), and the semiconductor IC devices of the first and second wafers may be the same or different, as required for use in a particular application.

In the fourth step (140) of the process according to the inventive methodology, the first semiconductor is segmented into a plurality of discrete square- or rectangular-shaped first dies or chips, each comprising an individual IC device and having opposed first and second (or lower and upper) major surfaces. Segmentation of the first semiconductor wafer may be accomplished in conventional manner, as by sawing utilizing a diamond-tipped or bladed saw. According to the next, i.e., fifth, step (150) of the invention, one of the first and second major surfaces, i.e., the lower surface, of each of the discrete first dies or chips, is bonded to the upper surface of a respective one of the unsegmented dies or chips comprising the second semiconductor wafer, as by adhesive bonding utilizing a layer of a tacky or low-flow adhesive, e.g., a "stage B" epoxy (i.e., wherein the epoxy monomer is partially pre-cured to an intermediate degree of polymerization) or other adhesive material conventionally employed for bonding of semiconductor dies and/or wafers, and, according to the sixth step (160) of the inventive methodology, the second semiconductor wafer comprised of a plurality of pairs of vertically stacked or sandwiched first and second IC dies or chips is itself segmented, as for example, by cutting with a diamond-tipped or -bladed saw, into a corresponding plurality of stacked die assemblies each comprising a discrete second IC die or chip having one of its opposed major surfaces (i.e., upper surface) adhesively bonded to one of the opposed major surfaces (i.e., lower surface) of a discrete first IC die or chip. The resultant stacked die assemblies, each comprised of a pair of discrete first and second IC dies or chips bonded together by means of a layer of adhesive material, are characterized by significantly increased mechanical robustness, i.e., resistance to flexure leading to warping, fracture, and/or other type breakage or damage, vis-a-vis either of the individual semiconductor dies or chips.

Figure 2:
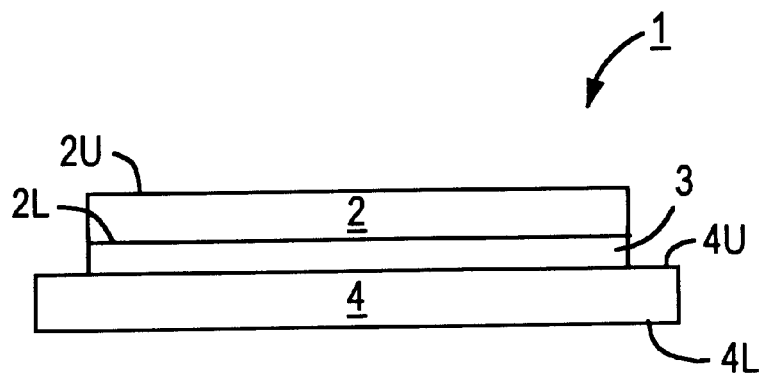
FIG. 2 is a schematic, cross-sectional view of a stacked die assembly after completion of die stacking/bonding/segmentation steps of the flow chart of FIG. 1 but prior to performance of the (final) substrate bonding step.

FIG. 2 illustrates, in schematic cross-sectional view, a stacked die assembly 1 fabricated according to the above-described process sequence, comprising a discrete first, upper IC die or chip 2 having an exposed upper major surface 2U and an opposed, lower major surface 2L bonded, via adhesive layer 3 of suitable thickness in the range of from about 0.5 to about 1.0 mil., to the upper major surface 4U of discrete second, lower IC die or chip 4, with the opposed, lower major surface 4L thereof available for subsequent bonding to the circuit board substrate. Each of the first (upper) and second (lower) dies or chips 2, 4 includes means (not shown in the drawing for illustrative simplicity) for making electrical contact thereto. In the embodiment illustrated in FIG. 2, the first, upper die or chip 2 is shown as having at least one slightly smaller lateral dimension than the second, lower die or chip 4 in order to facilitate electrical contacting of the latter. However, inasmuch as each of the upper and lower dies or chips can be electrically contacted according to various known arrangements, use of a discrete first, upper die or chip 2 which is smaller than the associated discrete second, lower die or chip 4 is not required, and, if desired or necessary, both dies or chips 2 and 4 may be coextensive.

In the next, i.e., seventh, step (170) according to the invention, at least one, and preferably a desired plurality of stacked die assemblies 1, each as illustrated in FIG. 2 and formed according to the inventive concepts of the above-described steps 1–6, are bonded, as by the use of a layer of suitable adhesive material, to a corresponding plurality of locations along the surface of the circuit board substrate to thereby form a stacked die module comprising a plurality of stacked die assemblies 1.

Figure 3:
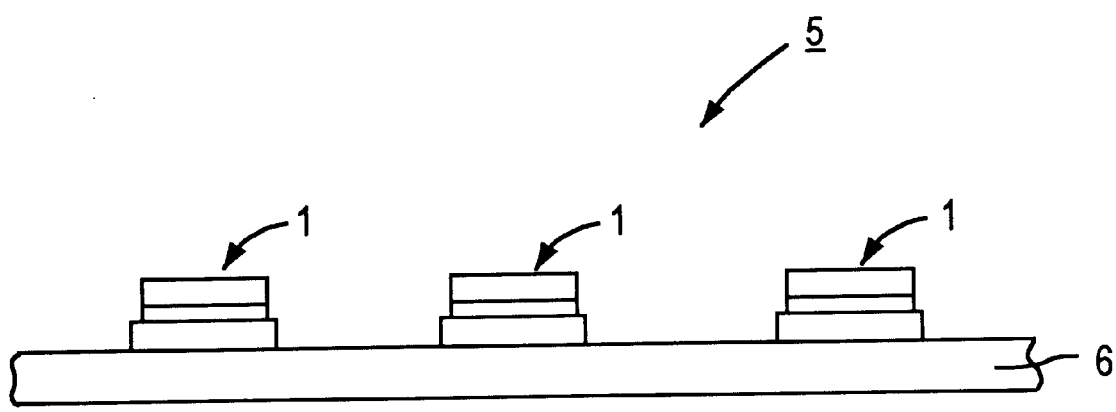
FIG. 3 is a schematic, cross-sectional view of a stacked die module comprising a plurality of stacked die assemblies mounted on a common substrate.

FIG. 3 illustrates, in schematic cross-sectional view, a stacked die module 5 comprising a plurality of stacked die assemblies 1 mounted on a laminated circuit board or other suitable substrate 6 (e.g., of ceramic-based material) via a layer 7 of adhesive material. The individual dies 2, 4 and stacked die assemblies 1 of stacked die module 5 are electrically connected to the circuit board substrate 6 and/or to each other, in conventional manner not described herein in detail in order not to unnecessarily obscure the present invention. If desired or necessary, n additional dies or chips, where n is an integer equal to or greater than 1, may then be bonded to the exposed upper surface of each of the stacked die assemblies 1. Finally, the entire assemblage is then encapsulated in a suitable encapsulating or potting material (not shown) to complete module formation.

A number of advantages over conventional processing technology for formation of stacked die assemblies and/or modules are thus provided by the inventive methodology, including, inter alia, simplicity, ease of manufacture, increased reliability and product yield with significantly decreased frequency of chip breakage/fracture due to warping resulting from non-planarity, etc. Further, the inventive methodology is fully compatible with the throughput requirements of automated semiconductor manufacture. Finally, the inventive principles or concepts are not limited to use with IC dies or chips but rather are applicable to performing rapid, reliable stacking of all manner of thin, fragile, and/or brittle components in the manufacture of various electrical and electronic devices.

In the previous description, numerous specific details have been set forth, such as specific materials, structures, processes, etc., in order to provide a better understanding of the present invention. However, the present invention can be practiced without resorting to the details specifically set forth. In other instances, well-known processing techniques and structures have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes and/or modifications within the scope of the inventive concept as expressed herein.

What is claimed is:

1. A method of making a stacked die assembly mounted on a substrate surface, comprising the steps of:

(a) providing a substrate having a surface for mounting thereon at least one stacked die assembly;

(b) providing first and second semiconductor wafers, each of said wafers including a plurality of semiconductor integrated circuit (IC) devices in the form of dies or chips each having a pair of opposed major surfaces;

(c) segmenting said first semiconductor wafer to form a plurality of discrete first dies or chips;

(d) bonding one of said pair of opposed major surfaces of each of said discrete first dies or chips to one of said pair of opposed major surfaces of a respective die or chip of said second semiconductor wafer;

(e) segmenting said second wafer to form a plurality of stacked die assemblies each comprising a stacked, bonded pair of discrete first and second dies or chips; and (f) bonding the other one of said pair of opposed major surfaces of said discrete second die or chip of one of said stacked die assemblies to said substrate surface.

2. The method according to claim 1, further comprising the step of:

(g) repeating step (f) at least once to bond at least one additional stacked die assembly formed in step (e) to said substrate surface, thereby forming a stacked die module.

3. The method according to claim 1, further comprising the steps of:

(g) providing an additional semiconductor wafer including a plurality of semiconductor (IC) devices in the form of dies or chips each having a pair of opposed major surfaces;

(h) segmenting said additional semiconductor wafer to form a plurality of discrete additional dies or chips; and (i) bonding one of said pair of opposed major surfaces of one of said plurality of discrete additional dies or chips to the other one of said pair of opposed major surfaces of said first discrete die or chip of said stacked die assembly bonded to said substrate surface.

4. The method according to claim 3, further comprising:

repeating steps (g)–(i) n times, where n is an integer equal to or greater than 1.

5. The method according to claim 1, wherein:

step (a) comprises providing a circuit board substrate.

6. The method according to claim 5, wherein:

step (a) includes providing a circuit board substrate including contacts for making electrical connection to at least one of said first and second discrete dies or chips of said stacked die assembly.

7. The method according to claim 1, wherein:

step (b) comprises providing first and second semiconductor wafers respectively comprising first and second semiconductor (IC) devices which are the same or different.

8. The method according to claim 7, wherein:

step (b) comprises providing first and second silicon (Si) semiconductor wafers.

9. The method according to claim 7, wherein:

step (b) comprises providing first and second gallium arsenide (GaAs) semiconductor wafers.

10. The method according to claim 1, wherein:

steps (c) and (e) each comprise utilizing a diamond saw for segmenting said first and second semiconductor wafers.

11. The method according to claim 1, wherein:

steps (d) and (f) each comprise adhesive bonding.

12. The method according to claim 11, wherein:

steps (d) and (f) each comprise utilizing an epoxy-based adhesive.

13. The method according to claim 12, wherein:

steps (d) and (f) each comprise utilizing a stage B epoxy-based adhesive.

14. A stacked die assembly mounted on a substrate surface, fabricated according to the following steps of:

(a) providing a substrate having a surface for mounting thereon at least one stacked die assembly;

(b) providing first and second semiconductor wafers, each of said wafers including a plurality of semiconductor (IC) devices in the form of dies or chips each having a pair of opposed major surfaces;

(c) segmenting said first semiconductor wafer to form a plurality of discrete first dies or chips;

(d) bonding one of said pair of opposed major surfaces of each of said discrete first dies or chips to one of said pair of opposed major surfaces of a respective die or chip of said second semiconductor wafer;

(e) segmenting said second wafer to form a plurality of stacked die assemblies each comprising a stacked, bonded pair of discrete first and second dies or chips; and (f) bonding the other one of said pair of opposed major surfaces of said discrete second die or chip of one of said stacked die assemblies to said substrate surface.

15. A stacked die module comprising a plurality of stacked die assemblies mounted on a substrate surface, fabricated by a method comprising repeating step (f) of claim 14 at least once to bond at least one additional stacked die assembly formed in step (e) to said substrate surface.

16. The stacked die module as in claim 15, wherein:

said substrate comprises a circuit board substrate including contacts for making electrical connection to at least one of said first and second discrete dies or chips of each of said stacked die assemblies;

said first and second semiconductor wafers comprise respective first and second semiconductor IC devices which are the same or different; and each of said bonding steps (d) and (f) comprises utilizing a layer of adhesive material.

17. The stacked die module as in claim 16, wherein:

each of said first and second semiconductor wafers comprises silicon (Si) or gallium arsenide (GaAs).

18. The stacked die module as in claim 16, wherein:

each of said layers of adhesive material comprises an epoxy-based adhesive material.

19. The stacked die module as in claim 18, wherein:

said epoxy-based adhesive material is utilized in the form of a stage B epoxy.

20. The stacked die module as in claim 16, wherein each of said stacked die assemblies further comprises n additional stacked dies or chips, where n is an integer equal to or greater than 1.

* * * * *

UNITED STATES PATENT AND TRADEMARK OFFICE
CERTIFICATE OF CORRECTION

PATENT NO. : 6,337,225 B1  Page 1 of 1
DATED : January 8, 2002
INVENTOR(S) : Sally Yin Lye Foong et al.

It is certified that error appears in the above-identified patent and that said Letters Patent is hereby corrected as shown below:

<u>Title page,</u>
Under ABSTRACT, change "20 Claims" to -- 13 Claims --.

<u>Columns 8-10,</u>
Delete the text of Claims 14-20.

Signed and Sealed this

First Day of October, 2002

*Attest:*

*Attesting Officer*

JAMES E. ROGAN
*Director of the United States Patent and Trademark Office*